(12) United States Patent
Park et al.

(10) Patent No.: US 6,239,487 B1
(45) Date of Patent: May 29, 2001

(54) LEAD FRAME WITH HEAT SPREADER AND SEMICONDUCTOR PACKAGE THEREWITH

(75) Inventors: Hee Jin Park; Dong Whan Cho; Soo Heon Kim; Jung Gun Park, all of Kyungsangbuk-do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/223,191

(22) Filed: Dec. 30, 1998

(30) Foreign Application Priority Data

Feb. 11, 1998 (KR) .................................................. 98-4029

(51) Int. Cl.[7] .......................... H01L 23/34; H01L 23/48; H01L 23/52

(52) U.S. Cl. .......................... 257/712; 257/666; 257/783; 257/793; 257/722

(58) Field of Search .................................. 257/712, 678, 257/666, 783, 796, 675, 793, 722

(56) References Cited

U.S. PATENT DOCUMENTS

| | | | |
|---|---|---|---|
| 5,359,222 | * 10/1994 | Okumoto et al. | 257/666 |
| 5,402,006 | 3/1995 | O'Donley | 257/796 |
| 5,430,331 | * 7/1995 | Hamzehdoost et al. | 257/796 |
| 5,442,234 | 8/1995 | Liang | 257/675 |
| 5,969,414 | * 10/1999 | Parthasarathi et al. | 257/675 |

* cited by examiner

Primary Examiner—Eddie C. Lee
Assistant Examiner—Jhihan B. Clark
(74) Attorney, Agent, or Firm—Fleshner & Kim, LLP

(57) ABSTRACT

A lead frame for a chip package includes a heat spreader and permits the mounting of various sized chips on the same sized lead frame. The lead frame includes a plurality of leads having outer portions and inner portions; a heat spreader having a rim portion adapted to be attached to ends of the inner portions of the leads and a projecting portion that projects between the ends of the inner portions of the leads such that an upper surface of the projecting portion is in approximately the same plane as an upper surface of the inner portions of the leads. An insulative adhesive may be used to attach the ends of the inner portions of the leads to the rim portion of the heat spreader. Also, insulation members may be attached to upper surfaces of the ends of the inner portions of the leads for receiving a large size chip.

29 Claims, 12 Drawing Sheets

LEAD FRAME WITH HEAT SPREADER AND SEMICONDUCTOR PACKAGE THEREWITH

BACKGROUND OF THE INVENTION

1. Field of the Invention

The present invention relates to a lead frame with a heat spreader, and a semiconductor package using the same.

2. Background of the Related Art

In general, a semiconductor packaging process is conducted in the manner described below using a lead frame. First, after fabrication of integrated circuits on a wafer, the wafer is separated into individual chips. Next, chip bonding is performed. As shown in FIG. 1A, during the chip bonding process each of the separated chips is attached to a die pad 14 of a lead frame with an epoxy 8. Wire bonding is then performed, during which, bonding pads 5 on the chip 4 and inner leads 2 of the lead frame are electrically connected with a conductive connecting member 6, which is typically gold wire. Then, a molding process is conducted, and the chip, the connecting members 6, the die pad 14 and the inner leads 2 are encapsulated for protection with an epoxy molding compound 10. Then, after the molding, tie bars and dam bars of the lead frame may be trimmed or cut off and the outer leads may be bent into a required form. The result is a semiconductor package as shown in FIG. 1A. The die pad 14 on the center of the lead frame, which is attached to a semiconductor chip, may also be called a paddle.

FIG. 1B illustrates a semiconductor package with a heat spreader. The heat spreader 3 is attached under the inner leads 2 with an insulative adhesive 7. A semiconductor chip 4 is attached to the heat spreader 3 with an epoxy 8. Conductive connecting members 6 of wire are used to electrically connect bonding pads 5 on the chip 4 to the inner leads 2. A molding compound 10 encapsulates the chip 4, the connecting members 6, the heat spreader 3 and the inner leads 2.

In the semiconductor package shown in FIG. 1B, the heat spreader 3 takes the role of the die pad of a lead frame as shown in FIG. 1B. However, in the semiconductor package as shown in FIG. 1B, the heat spreader 3 extends underneath the inner leads 2. A maximum size of a chip mountable on the heat spreader 3 is limited to the distance between the inner leads 2, as shown in FIG. 2.

When the chip size exceeds the maximum dimension shown in dotted lines in FIG. 2, a new lead frame with a larger heat spreader must be developed. Because the development of a new lead frame takes a long time (more than 5 months), and application of the new lead frame to a production line is impossible during the time of development, a deadlock in the production is caused. Also, frequent re-arrangement of a production line to accommodate different size lead frames increases costs and reduces productivity.

SUMMARY OF THE INVENTION

It is an object of the present invention to obviate one or more of the problems, limitations and disadvantages of the background art described above.

It is also an object of the present invention to provide a semiconductor package which allows mounting of various sized chips on a single size lead frame having a heat spreader.

Another object of the present invention is to provide an improved semiconductor package with a heat spreader which has improved heat dissipation properties, and which eliminates or reduces defects in the molding process.

A lead frame embodying the invention includes a plurality of leads having outer portions and inner portions, a heat spreader having a rim portion attached to ends of the inner portions of the leads, wherein a projecting portion of the heat spreader projects between ends of the inner portions of the leads. A lead frame embodying the invention may also include a plurality of recesses or a plurality of projections that are formed on a surface of the heat spreader opposite the projecting portion. An upper surface of the projecting portion of the heat spreader may be located in substantially the same plane as upper surfaces of the inner portions of the leads. Furthermore, a lead frame embodying the invention may include a plurality of aperture or holes that pass through the heat spreader adjacent the rim portion.

A semiconductor package embodying the invention would include a plurality of leads having inner portions and outer portions; a heat spreader having a rim portion attached to the inner portions of the leads and a projecting portion that projects between the ends of the inner portions of the leads; a chip having a plurality of bond pads that is attached to the projecting portion of the heat spreader, a plurality of conductive connecting members that electrically couple bond pads on the chip to respective ones of the inner portions of the leads, and a molded resin body. A semiconductor package embodying the invention may be arranged such that an upper surface of the projecting portion of the heat spreader that is attached to the chip is located in substantially the same plane as upper surfaces of the inner portions of the leads. Also, a semiconductor package embodying the invention may include a heat spreader that has projections or recessed portions on a surface of the heat spreader opposite the projecting portion. Still further, a semiconductor package embodying the invention may include a heat spreader that has apertures or holes passing through the heat spreader adjacent the rim portion.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

Preferred embodiments of the present invention will be explained with reference to the following drawing figures, wherein like reference numerals refer to like elements, and wherein.

DETAILED DESCRIPTION OF PREFERRED EMBODIMENTS

Figure 3A:
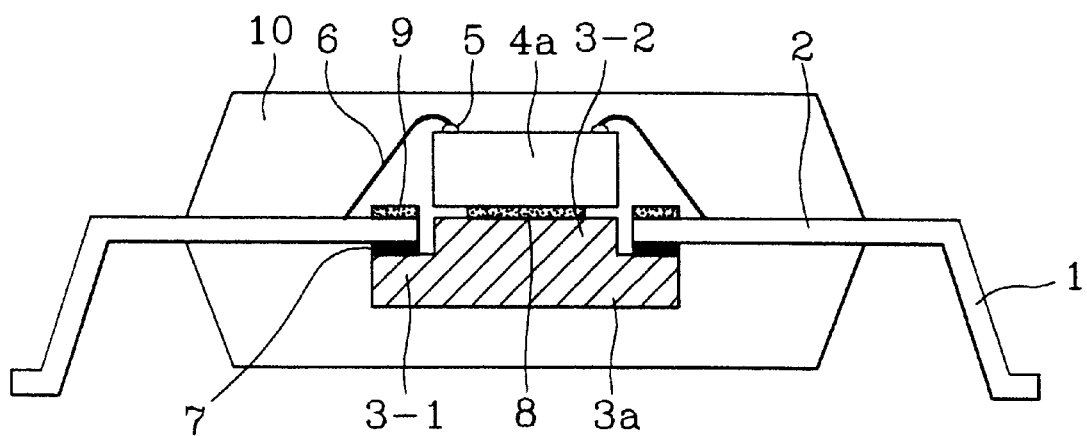
FIGS. 3A and 3B illustrate sections of a semiconductor package in accordance with a first preferred embodiment of the present invention.

Referring to FIG. 3A, a semiconductor package in accordance with a first preferred embodiment of the present invention includes a plurality of leads having outer portions 1 and inner portions 2. A heat spreader 3 has a rim portion 3-1 located under ends of the inner portions 2, and a projecting portion 3-2 located between the ends of the inner portions 2 of the leads. An upper surface of the projecting portion 3-2 is in approximately the same plane as upper surfaces of the inner portions 2 of the leads. A semiconductor chip 4a is attached to an upper surface of the heat spreader 3a. Conductive connecting members 6 connect a plurality of bonding pads 5 on the semiconductor chip 4a to respective ones of the inner portions 2 of the leads. An insulative adhesive 7 coated under the ends of the inner portions 2 of the leads attaches the heat spreader 3a to the inner portions 2, and an adhesive 8 attaches the chip 4a to the heat spreader 3a.

Figure 1A:
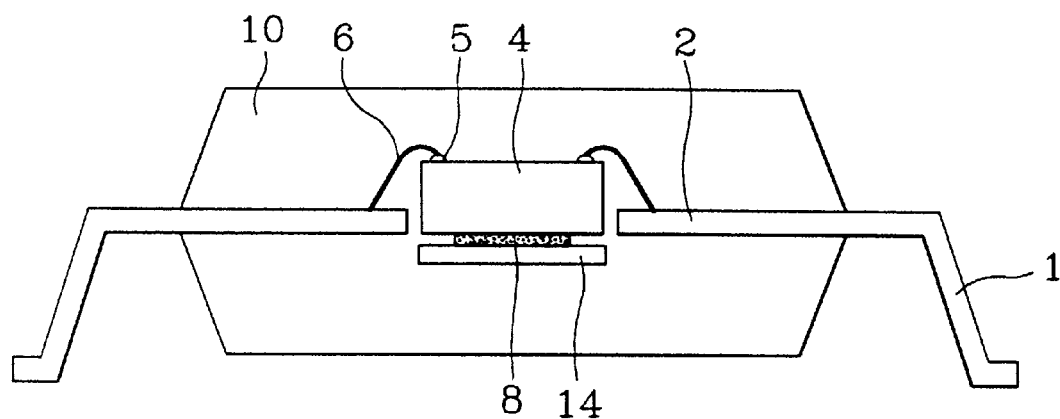
FIGS. 1A and 1B illustrate sections of background art semiconductor packages.
Figure 1B:
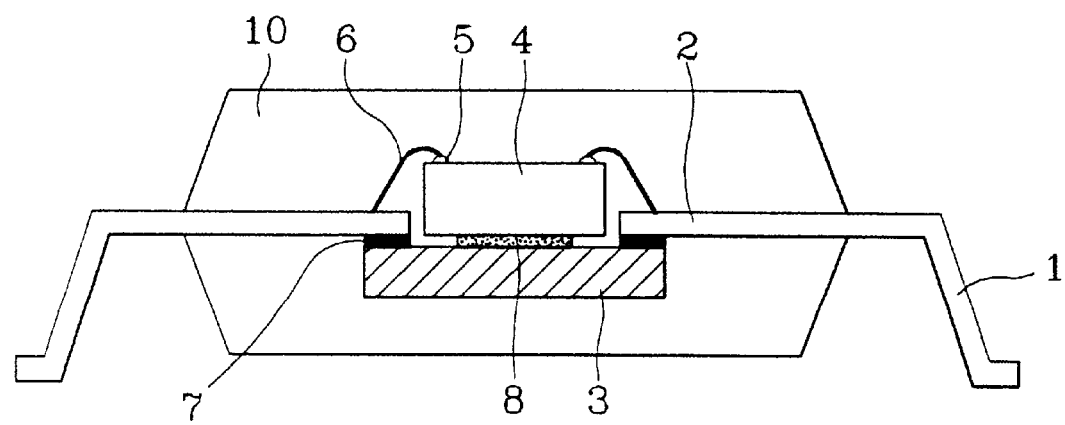
Figure 2:
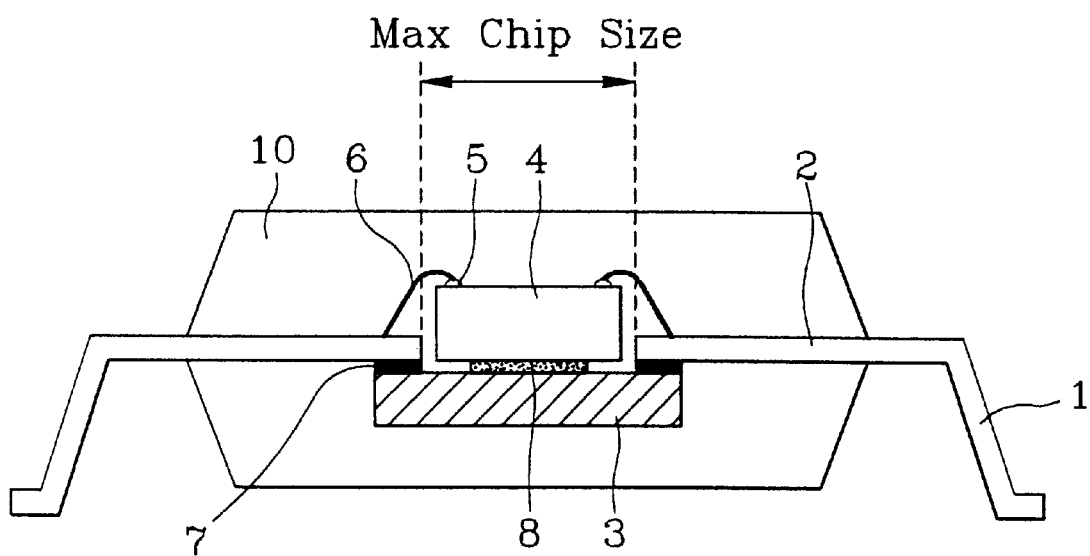
FIG. 2 illustrates a section of a background art semiconductor package with a heat spreader.

With a heat spreader 3a as shown in FIG. 1A, the chip attached to the heat spreader 3a may be a small chip 4a having a width approximately the same size as the width of the projecting portion 3-2 of the heat spreader 3a. Alternatively, the chip may be a large chip 4b having a width exceeding the size of the projecting portion 3-2, as shown in FIG. 1B. In the case of large chip 4b, it is preferable to provide an insulating member 9 between the ends of the inner portions 2 of the leads and the chip 4b. Because the chip is mounted on the upper surface of the projecting portion 3-2 of the heat spreader 3a, which is substantially level with the upper surfaces of the inner portions 2 of the leads, different sized chips can be mounted on the same size lead frame. This, in turn, eliminates the necessity for designing and fabricating different sized lead frames for different sized chips, which reduces costs and production set up time.

Figure 4A:
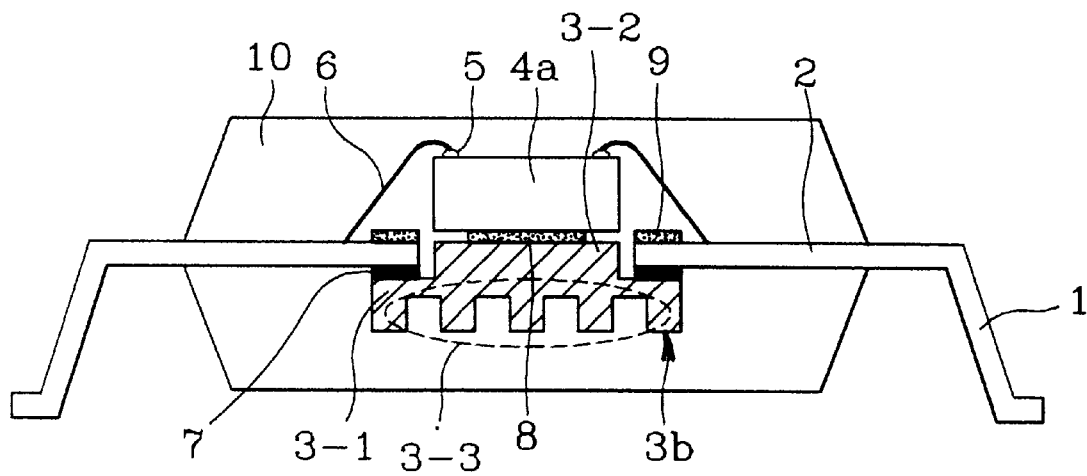
FIGS. 4A and 4B illustrate sections of a semiconductor package in accordance with a second preferred embodiment of the present invention.
Figure 4B:
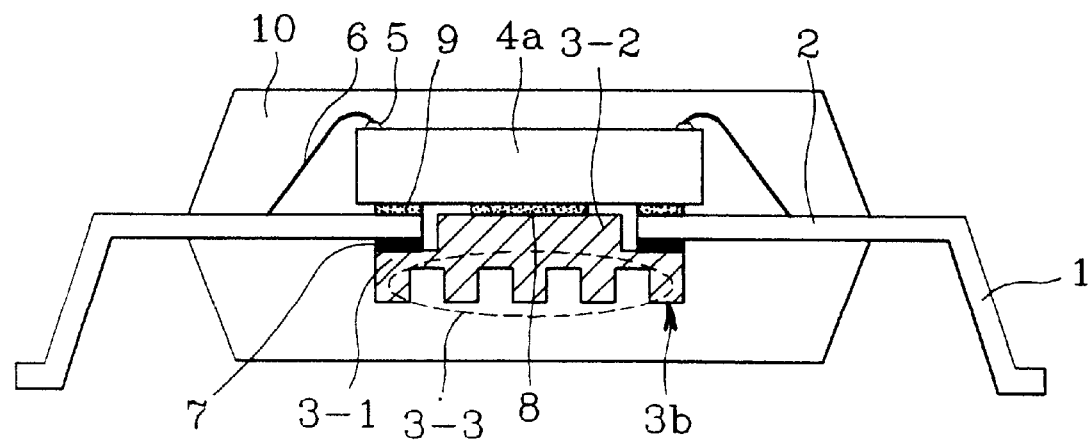

FIGS. 4A and 4B illustrate sections of semiconductor packages in accordance with a second preferred embodiment of the present invention. FIG. 4A illustrates a section of a small chip application, and FIG. 4B illustrates a section of a large chip application.

A semiconductor package in accordance with the second preferred embodiment includes a plurality of leads having outer portions 1 and inner portions 2. A heat spreader 3b has a rim portion 3-1 adapted to be attached under ends of the inner portions 2 of the leads. A projecting portion 3-2 projects from the rim portion 3-1 such that the projecting portion 3-2 is located between ends of the inner portions 2 of the leads. An upper surface of the projecting portion 3-2 is located in substantially the same plane as an upper surface of the inner portions 2 of the leads. A semiconductor chip 4a or 4b is attached to the upper surface of the heat spreader 3b. Conductive connecting members 6 electrically connect bonding pads 5 on the semiconductor chip and respective ones of the inner portions 2 of the leads. An insulative adhesive 7 attaches ends of the inner portions 2 of the leads to the heat spreader 3b. An adhesive 8 attaches an upper surface of the heat spreader 3b to the chip 4a or 4b.

In this case, like the first embodiment, the chip attached to the heat spreader 3b may be a small chip 4a having a width that is approximately the same size as the projecting portion 3-2 of the heat spreader 3b, or the chip may be a large chip 4b having a width that exceeds the size of the projecting portion 3-2. In the case of a large chip 4b, it is preferable to provide an insulating member 9 between the ends of the inner portions 2 of the leads, and the chip.

The second embodiment of the semiconductor package of the present invention not only has the same advantages as the first embodiment, but also has improved heat dissipation properties compared to the first embodiment. In the second embodiments shown in FIGS. 4A and 4B, projections and recesses 3-3 are formed on a bottom surface of the heat spreader 3b to provide an increased contact area with the molding resin body 10. This increases a heat dissipation capability of the package.

Figure 5:
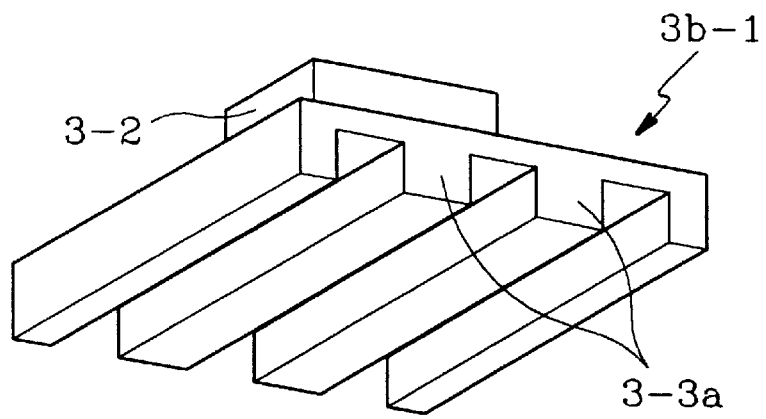
FIG. 5 illustrates a perspective bottom view of one form of the heat spreaders shown in FIGS. 4A and 4B.

FIG. 5 illustrates a perspective bottom view of one form of the heat spreader 3b-1 shown in FIGS. 4A and 4B. In this embodiment, the projections and recesses may be in the form of rails 3-3a.

Figure 6:
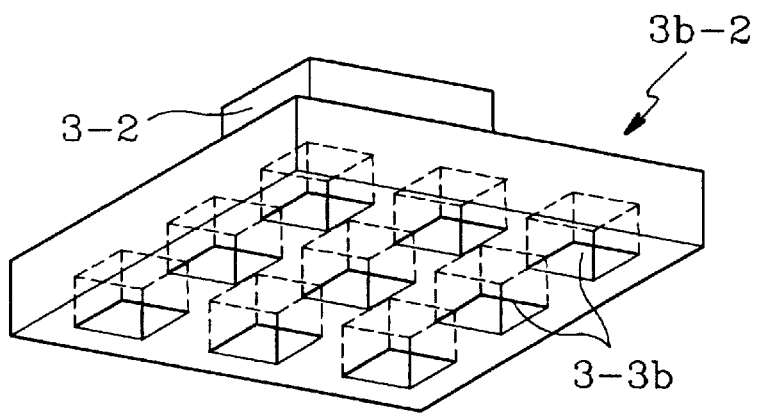
FIG. 6 illustrates a perspective bottom view of another form of the heat spreaders shown in FIGS. 4A and 4B.

FIG. 6 shows an alternate embodiment of the heat spreader 3b-2, which is used in the second embodiment of the package shown in FIGS. 4A and 4B. In this embodiment, cube-shaped or hexahedral recesses 3-3b are formed on the bottom surface of the heat spreader 3b-2.

Figure 7:
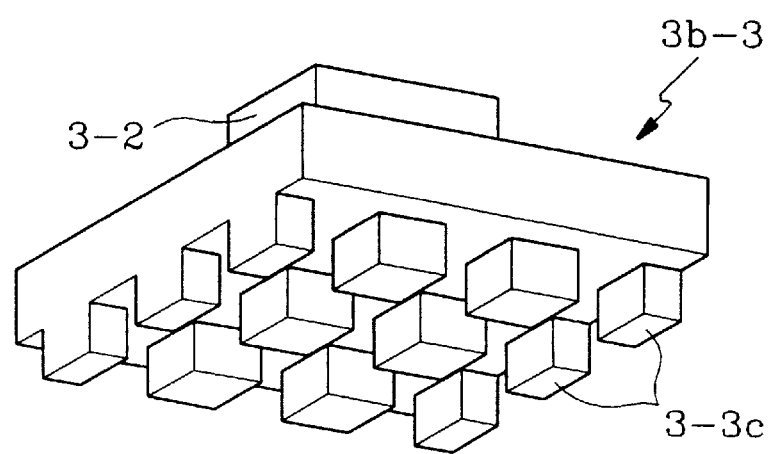
FIG. 7 illustrates a perspective bottom view of a further form of the heat spreaders shown in FIGS. 4A and 4B.

FIG. 7 illustrates a perspective bottom view of another alternate form of the heat spreader 3b-3 used in the second embodiment of the package, as shown in FIGS. 4A and 4B. In this embodiment, cube-shaped or hexahedral projections 3-3c are formed on the bottom surface of the heat spreader 3b-3.

Figure 8A:
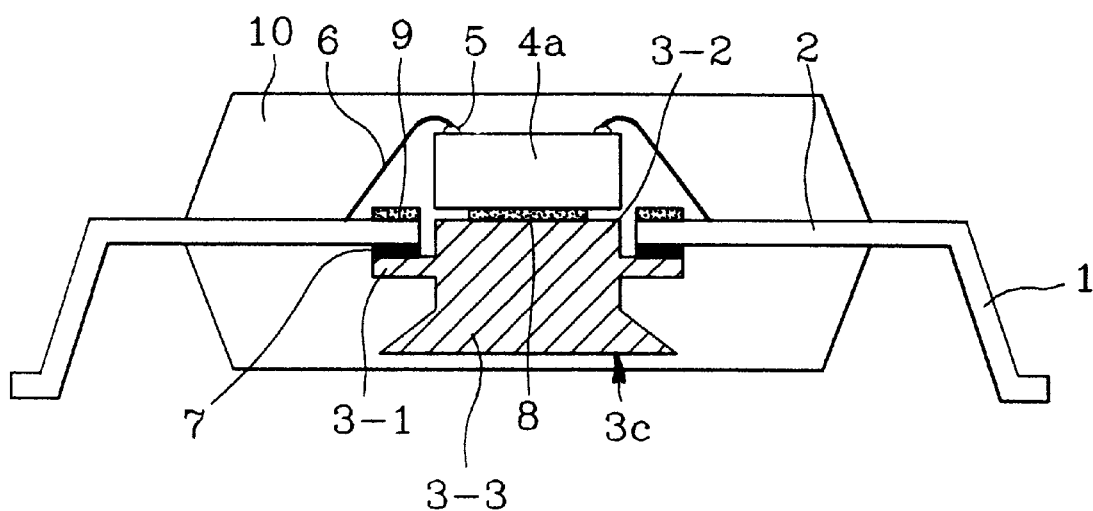
FIGS. 8A and 8B illustrate sections of a semiconductor package in accordance with a third preferred embodiment of the present invention.
Figure 8B:
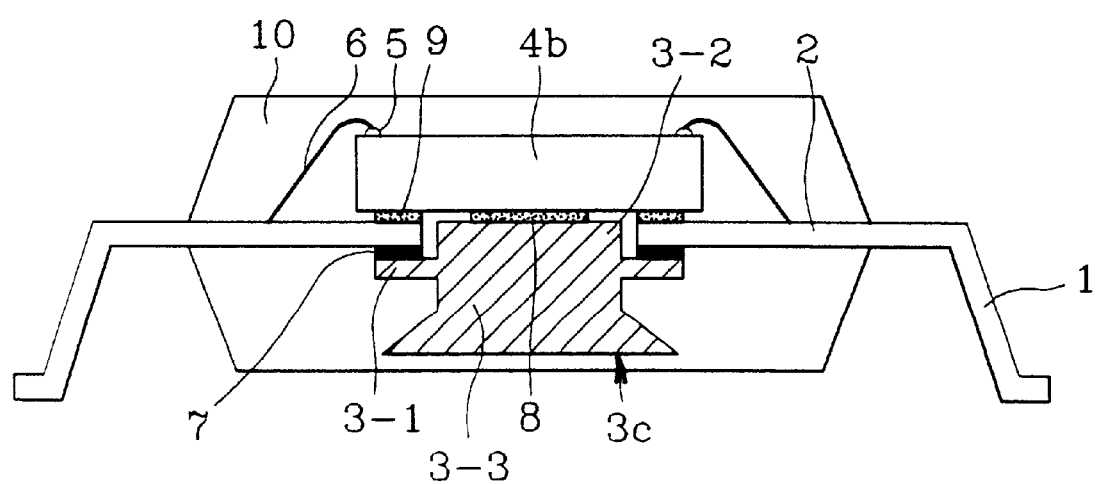

FIGS. 8A and 8B illustrate sections of a semiconductor package in accordance with a third preferred embodiment of the present invention. FIG. 8A illustrates a section of a small chip application, and FIG. 8B illustrates a section of a large chip application.

The third preferred embodiment of the present invention includes a plurality of leads having outer portions 1 and inner portions 2. A heat spreader 3c has a rim portion 3-1 adapted to be attached under ends of the inner portions 2 of the leads. A projecting portion 3-2 of the heat spreader 3c projects between the ends of the inner portions 2 of the leads such that an upper surface of the projecting portion 3-2 is in substantially the same plane as an upper surface of the inner portions 2. A lower portion 3-3 of the heat spreader 3c has a greater width than the projecting portion 3-2. The heat spreader 3c may flare outward toward the bottom, as shown in FIGS. 8A and 8B. Conductive connecting members 6 electrically connect bonding pads 5 on the semiconductor chip 4a or 4b with respective ones of the inner portions 2 of the leads. Insulative adhesive 7 attaches ends of the inner portions 2 of the leads to the heat spreader 3c. An adhesive 8 attaches an upper surface of the heat spreader 3c to the chip 4a or 4b.

In this case, as in the first and second embodiments, the chip that is attached to the heat spreader 3c may be a small chip 4a having a width approximately the same size as the projecting portion 3-2 of the heat spreader 3c, or the chip may have a size that exceeds the size of the projecting portion 3-2 of the heat spreader 3c. In the case of a large chip 4b, it is preferable to provide an insulating member 9 between the ends of the inner portions 2 of the leads and the chip 4b.

Figure 3B:
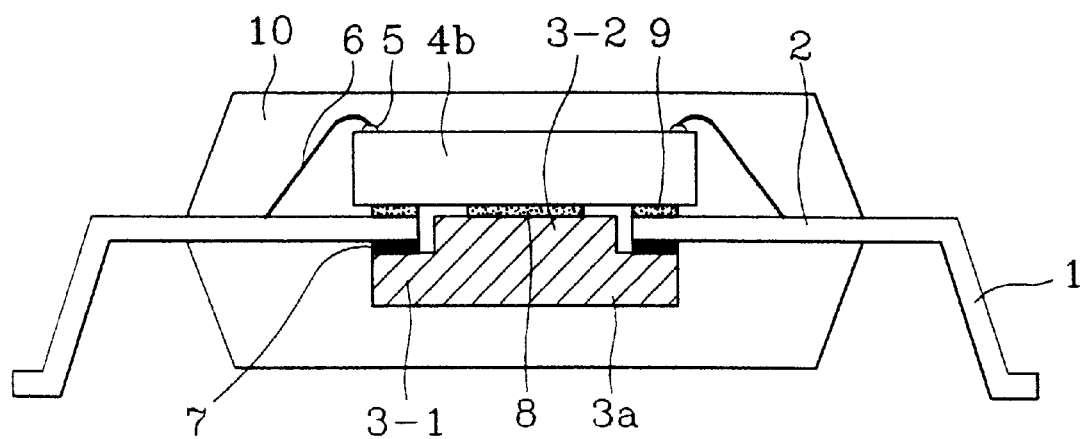

The third embodiment of the present invention not only has the same advantages as the first embodiment shown in FIGS. 3A and 3B, but also has improved heat dissipation properties like the second embodiment shown in FIG. 4A and 4B. That is, because a lower portion 3-3 of the heat spreader 3c has a width that is greater than a width of the projecting portion 3-2. The larger width flared portion 3-3 increases the contact surface of the heat spreader 3c relative to the molded resin body 10.

FIGS. 9A–9F illustrate steps of a resin encapsulation method that can be used to create the semiconductor package shown in FIG. 3A, and problems that may occur during the encapsulation process. It is known that unfilled portions or voids may occur when a flow of the epoxy molding compound 10a along upper and lower sides of the package is not uniform.

Figure 9A:
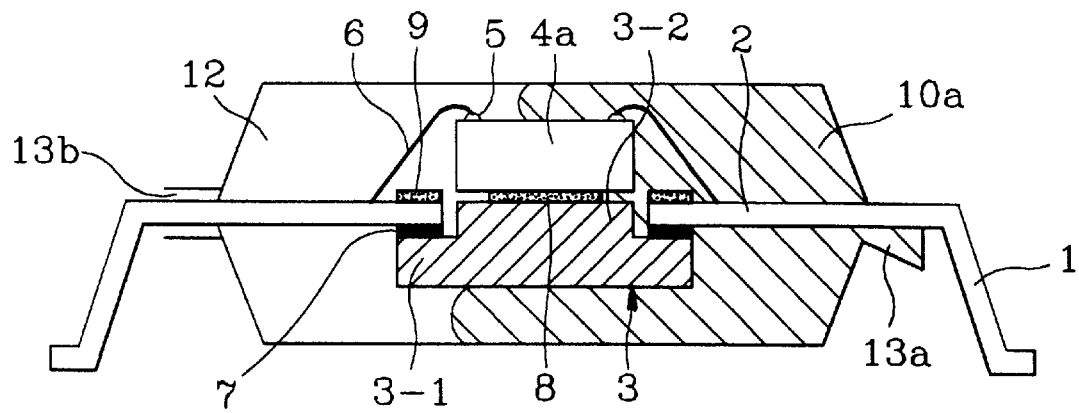
FIGS. 9A–9F illustrate sections showing the steps of a resin encapsulation process of the semiconductor package shown in FIG. 3B, and the problems that may occur in the process.
Figure 9B:
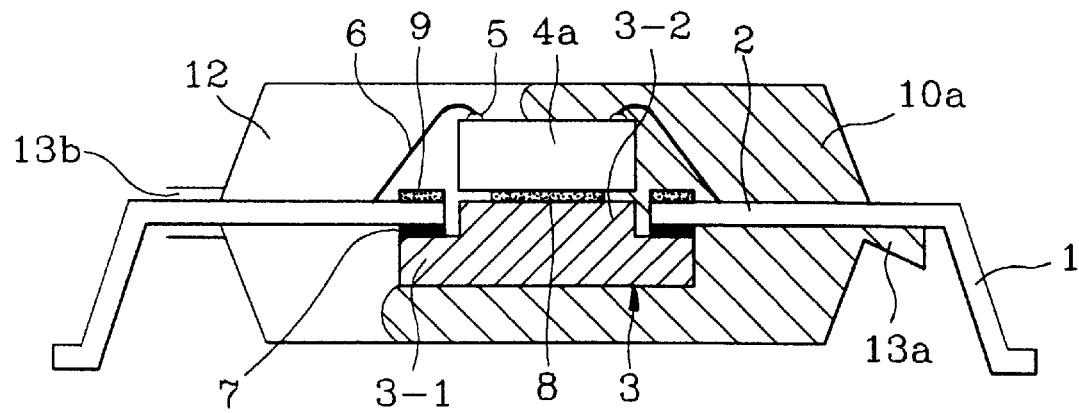
Figure 9C:
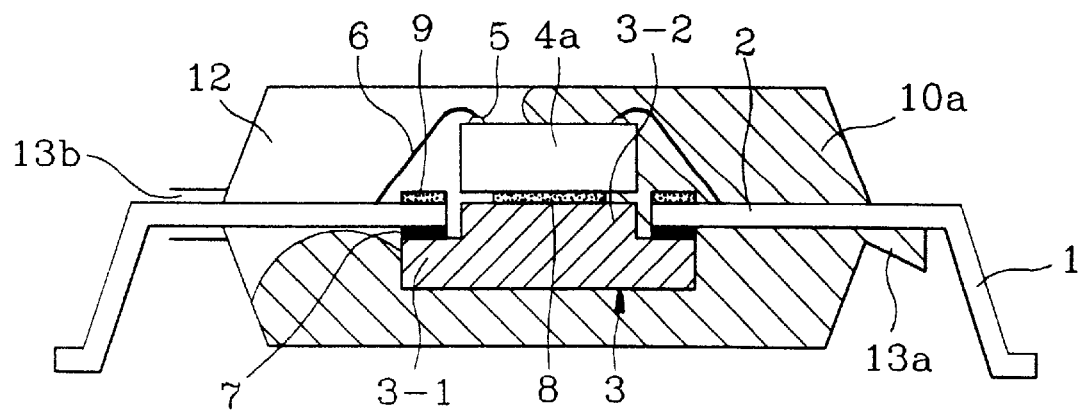
Figure 9D:
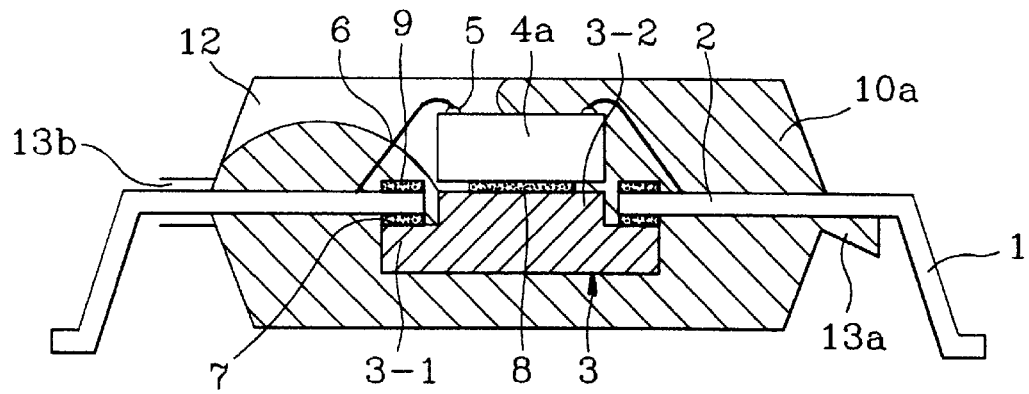

During a molding process, an epoxy molding compound 10a is injected into a mold surrounding the heat spreader 3, chip 4a and inner portions 2 of the leads. The epoxy molding compound 10a is typically injected through an inlet port 13a, from one side toward the other, and air inside the mold is vented through an outlet port 13b. FIG. 9A shows the epoxy molding compound 10a after it has progressed approximately half way from right to left inside the mold cavity. FIG. 9B shows a situation where the epoxy molding compound 10a has extended further across the bottom of the heat spreader 3 than the epoxy molding compound at the top of the mold cavity. This process continues in FIG. 9C and in FIG. 9D as the epoxy molding compound progresses across the bottom of the heat spreader 3, and up in between the inner portions 2 of the leads.

Figure 9E:
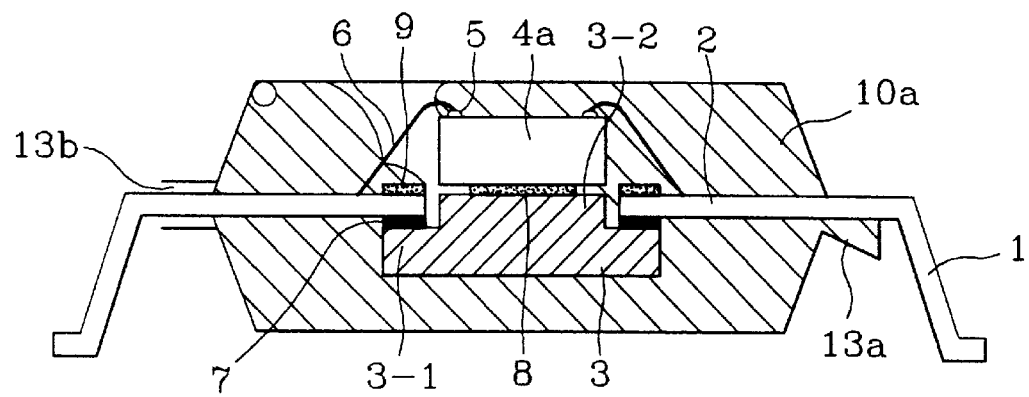
Figure 9F:
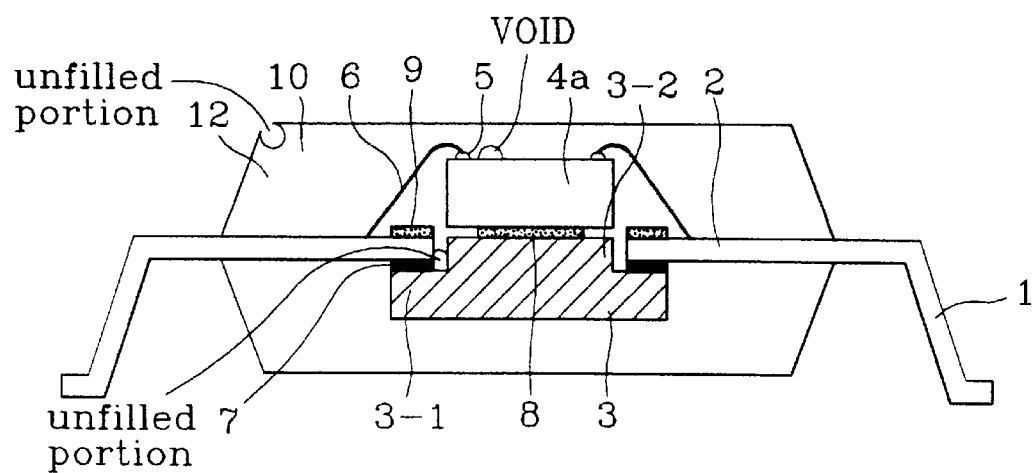

During the final stages of filling the mold cavity, voids can be created, as shown in FIGS. 9E and 9F. For instance, a void can be formed between the end of the inner lead 2 and the protruding portion 3-2 of the heat spreader 3. A void could also be formed in an upper quarter of the mold cavity, and adjacent the bond pads 5 on the semiconductor chip 4a.

Figure 10A:
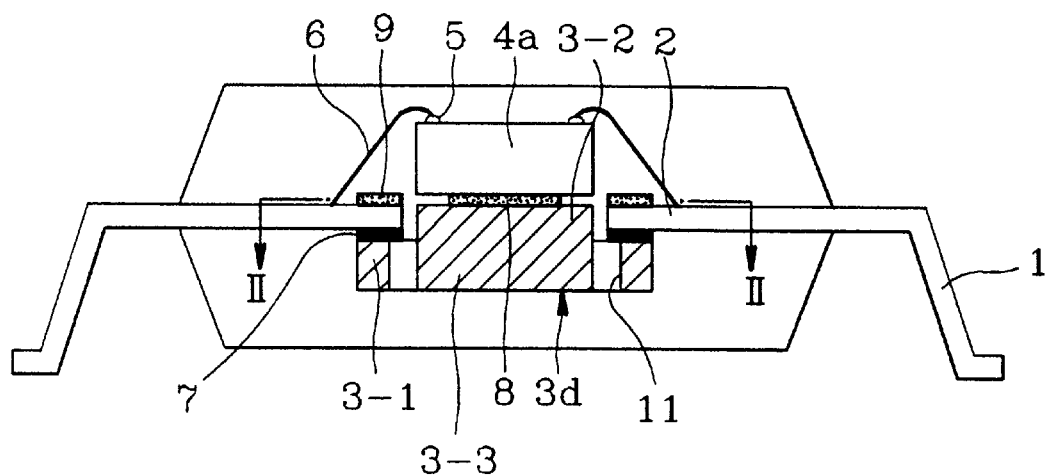
FIGS. 10A–10B illustrate sections showing a fourth embodiment of the present invention for solving the problems shown in FIGS. 9A–9F.
Figure 10B:
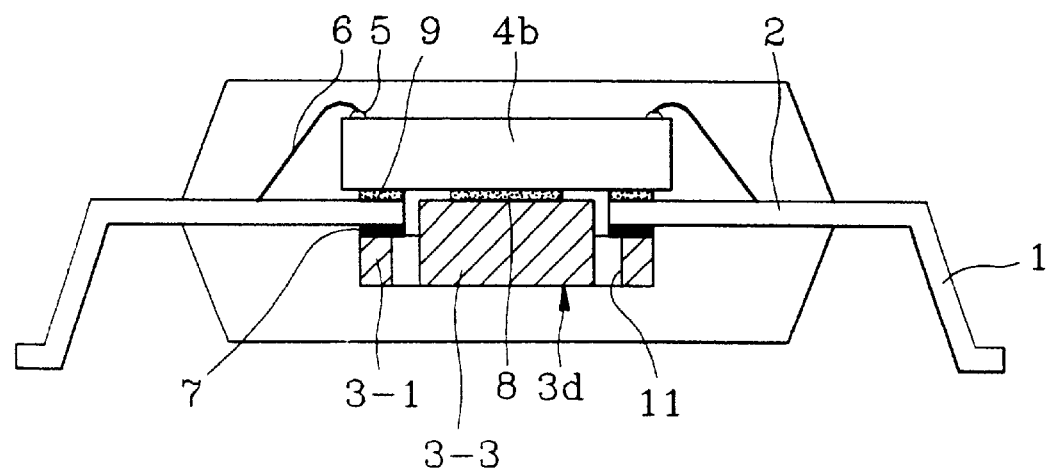
Figure 11:
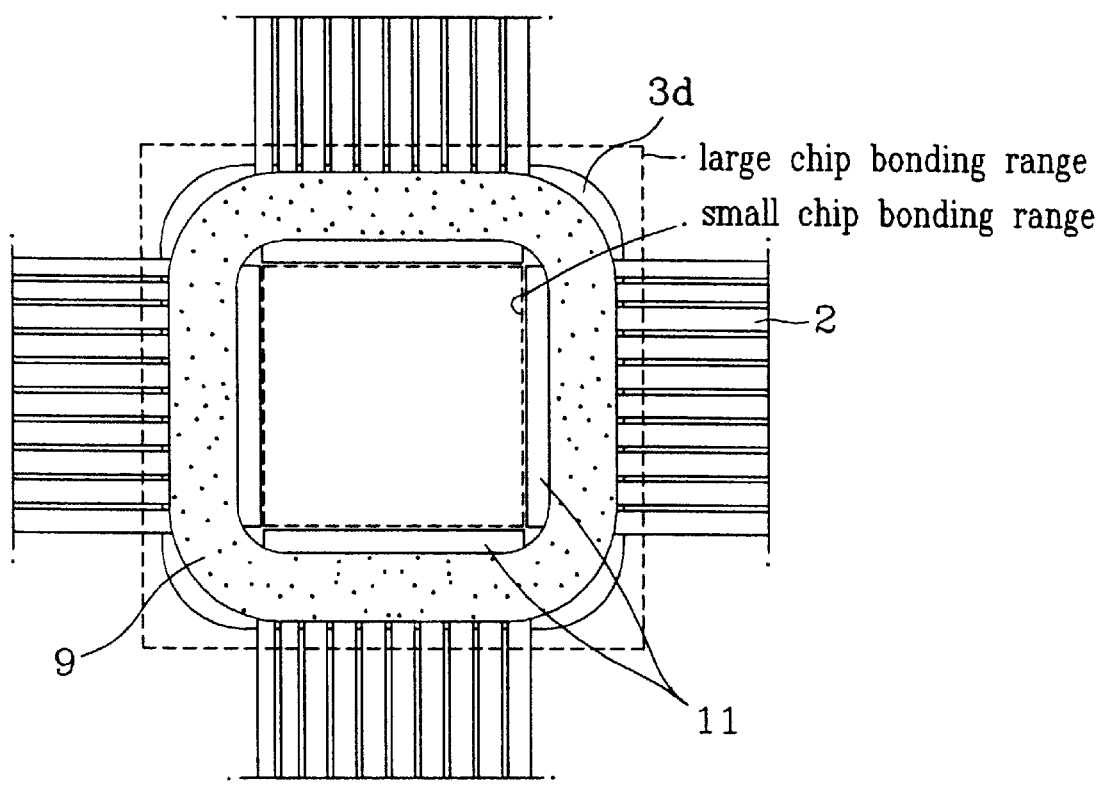
FIG. 11 illustrates a section of the embodiment shown in FIG. 10A taken along section line 11—11.
Figure 12A:
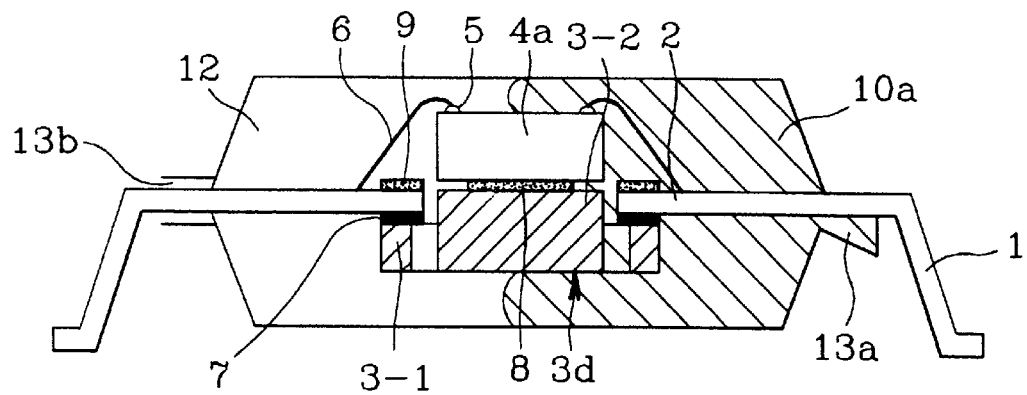
FIGS. 12A–12F illustrate sections showing the steps of a resin encapsulation process of the semiconductor package of the fourth embodiment.
Figure 12B:
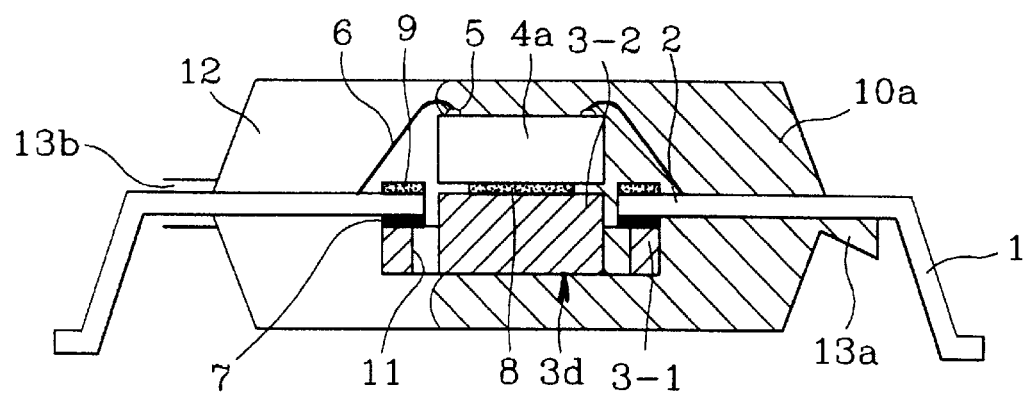
Figure 12C:
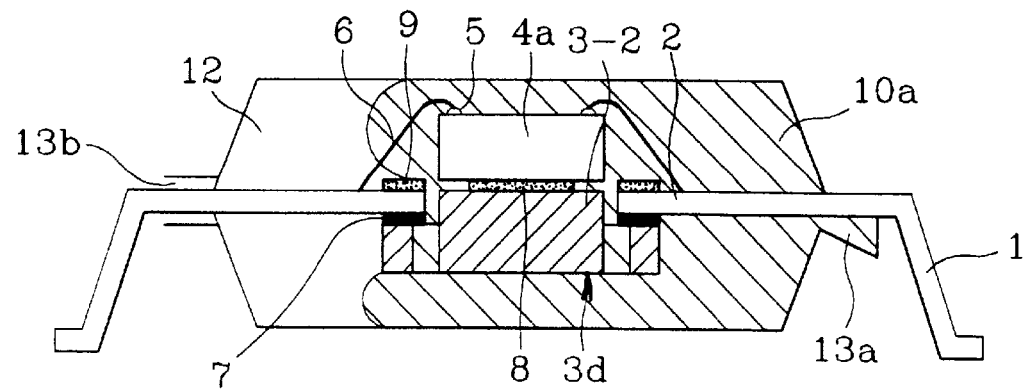
Figure 12D:
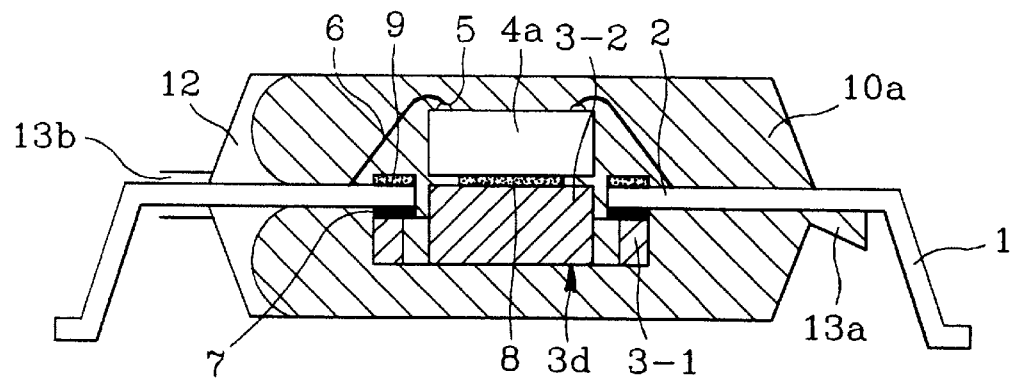
Figure 12E:
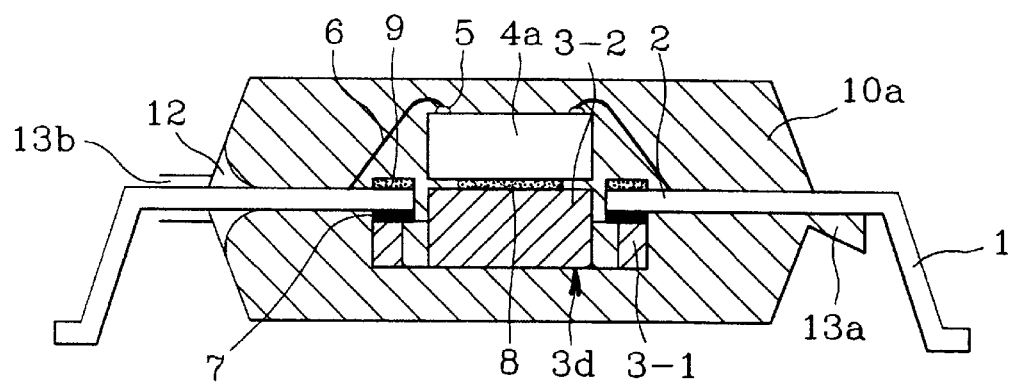
Figure 12F:
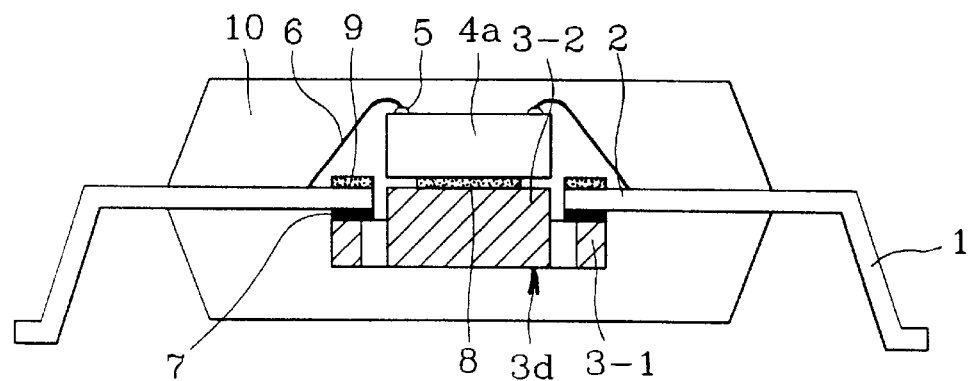

FIGS. 10A, 10B and 11 illustrate a fourth embodiment of the present invention that can solve the void formation problem shown in FIGS. 9A–9F. FIG. 10A illustrates a section of a small chip application, and FIG. 10B illustrates a section of a large chip application. FIG. 11 shows a sectional view taken along section line 11—11 in FIG. 10A.

The semiconductor package in accordance with the fourth preferred embodiment includes a plurality of leads having outer portions 1 and inner portions 2. A heat spreader 3d has a rim portion 3-1 attached under ends of the inner portions 2 of the leads. A projecting portion 3-2 projects from the rim portion and between the ends of the inner portions 2 of the leads such that an upper surface of the heat spreader 3d is in approximately the same plane as an upper surface of the inner portions 2 of the leads. Pass-through holes 11 formed through the heat spreader 3d connect the space between the ends of the inner portions 2 of the leads and an outer circumference of the projecting portion 3-2 with a lower portion 3-3 of the heat spreader 3d. A chip 4a or 4b is attached to an upper surface of the heat spreader 3d. Conductive connecting members 6 electrically connect bonding pads 5 on the semiconductor chip 4a or 4b with respective ones of the inner portions 2 of the leads. Insulative adhesive 7 attaches ends of the inner portions 2 of the leads to the heat spreader 3d. An adhesive 8 attaches an upper surface of the heat spreader 3d to the chip 4a or 4b.

In this case, like the first to third embodiments, the chip attached to the heat spreader 3d may be a small chip 4a having a width that is approximately the same size as the projecting portion 3-2 of the heat spreader 3d, or the chip may be larger than the size of the projecting portion 3-2. In the case of a large chip 4b, as shown in FIG. 10b, it is preferable to provide an insulating member 9 between the ends of the inner leads 2 and the chip 4b.

The fourth embodiment of the semiconductor package of the present invention not only has the same advantages as the first embodiment, but also solves the void creation problem caused by non-uniform flow of epoxy molding compound 10a during the encapsulation process.

FIGS. 12A–12F illustrate steps of a resin encapsulation process used to form the semiconductor package of the fourth embodiment. As shown in FIGS. 12A–12E, the passthrough holes 11 in the heat spreader 3d compensate for a flow speed difference between the upper and lower portions of a mold cavity. Thus, the filling rates are approximately the same for the upper and lower portions of the mold cavity and air vents through an air vent 13b in a smooth manner. Thus, all the space surrounding the bottom of the chip 4a, the heat spreader 3d and the ends of the inner portions 2 of the leads is filled with epoxy as well as corners of the package. This design for the heat spreader 3d prevents defects due to voids and unfilled portions.

As has been explained, the present invention allows packaging of various sized semiconductor chips on the same size lead frame having a heat spreader. The semiconductor packages embodying the invention also improve heat dissipation properties and eliminate molding defects such as unfilled portions, thereby improving package reliability.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. For example, although a metal heat spreader and a carbon fiber heat spreader may not be structural equivalents in that a metal heat spreader conducts heat in all directions more or less evenly, whereas a carbon fiber heat spreader conducts heat more easily in the direction of the fibers, in the environment of heat spreaders for semiconductor packages, a metal heat spreader and a carbon fiber heat spreader may be equivalent structures.

What is claimed is:

1. A lead frame, comprising:
   a plurality of leads having and outer portions and inner portions; and
   a heat spreader having a rim with inner and outer portions and a projecting portion, located adjacent the inner portion of the rim, having an upper surface that projects above lower surfaces of the ends of the inner portions of the leads, wherein the inner portions of the leads are attached to the outer portion of the rim of the heat spreader by an adhesive.

2. A lead frame as claimed in claim 1, wherein a plurality of recesses are formed on a surface of the heat spreader opposite the projecting portion.

3. A lead frame as claimed in claim 1, wherein a plurality of projections are formed on a surface of the heat spreader opposite the projecting portion.

4. A lead frame as claimed in claim 1, wherein a surface of the heat spreader opposite the projecting portion has a width that is greater than a width of an intermediate portion of the heat spreader.

5. A lead frame as claimed in claim 1, wherein apertures are formed through the heat spreader adjacent to the rim portion of the heat spreader.

6. The lead frame as claimed in claim 1, wherein the adhesive is insulative.

7. The lead frame as claimed in claim 1, further comprising insulation members that are attached to surfaces of the inner portions of the leads that are opposite the rim portion of the heat spreader.

8. The lead frame as claimed in claim 1, further comprising an adhesive member attached to an upper surface of the projecting portion of the heat spreader.

9. The lead frame as claimed in claim 1, wherein a surface of the projecting portion of the heat spreader is in substantially the same plane as upper surfaces of the inner portions of the leads.

10. The lead frame of claim 1, wherein one of recesses and projections are formed on a surface of the heat spreader opposite the projecting portion, and wherein the projections and recesses are one of a cube, hexahedral, and rail shape.

11. The lead frame of claim 1, wherein a portion of the heat spreader opposite the projecting portion is wider than the projecting portion of the head spreader.

12. A lead frame as claimed in claim 7, wherein the insulation members are configured to prevent electrical coupling between the inner portions of the leads and a chip mounted thereon, and wherein each insulation member includes:
    an insulative adhesive layer attached to a surface of an inner portion of a lead, and
    an insulative film layer attached to the insulative adhesive layer.

13. A semiconductor package, comprising:
    a plurality of leads having outer portions and inner portions;
    a heat spreader having a rim portion attached to ends of the inner portions of the leads and a projecting portion having an upper surface that projects above lower surfaces of the ends of the inner portions of the leads;
    a chip having a plurality of bonding pads attached to an upper surface of the projecting portion of the heat spreader;
    insulation members attached to surfaces of the inner portions of the leads that are opposite the rim portion of the heat spreader;
    a plurality of conductive connecting members, wherein each conductive connecting member electrically couples a bonding pad of the chip to a respective one of the inner portions of the leads; and,
    a molding resin body.

14. A semiconductor package as claimed in claim 13, wherein an adhesive attaches the heat spreader to the chip.

15. The package as claimed in claim 13, wherein an upper surface of the projecting portion of the heat spreader is in substantially the same plane as upper surfaces of the inner portions of the leads.

16. The package as claimed in claim 13, wherein the chip has a width that is greater than a width of the projecting portion of the heat spreader, and wherein the chip is attached to the upper surface of the projecting portion of the heat spreader with an adhesive member.

17. The package as claimed in claim 13, wherein apertures are formed through the heat spreader adjacent the rim portion of the heat spreader.

18. The package as claimed in claim 13, wherein apertures are formed in a surface of the heat spreader opposite the projecting portion.

19. The package as claimed in claim 13, wherein projections are formed on a surface of the heat spreader opposite the projecting portion.

20. The package as claimed in claim 13, wherein a surface of the heat spreader opposite the projecting portion has a width that is greater than a width of an intermediate portion of the heat spreader.

21. The semiconductor package of claim 13, wherein one of recesses and projections are formed on a surface of the heat spreader opposite the projecting portion, and wherein the projections and recesses are one of a cube, hexahedral, and rail shape.

22. The semiconductor package of claim 13, wherein a portion of the heat spreader opposite the projecting portion is wider than the projecting portion of the head spreader.

23. A semiconductor package as claimed in claim 13, wherein the adhesive is an epoxy.

24. A semiconductor package as claimed in claim 13, wherein the adhesive is an insulative adhesive.

25. A semiconductor package, comprising:
    a plurality of leads having outer portions and inner portions;
    a heat spreader having a rim portion attached to ends of the inner portions of the leads and a projecting portion that projects between ends of the inner portions of the leads;
    a chip having a plurality of bonding pads attached to an upper surface of the projecting portion of the heat spreader, wherein the chip has a width greater than a width of the projecting portion of the heat spreader;
    a plurality of conductive connecting members, wherein each conductive connecting member electrically couples a bonding pad of the chip to a respective one of the inner portions of the leads; and
    a molding resin body.

26. The package of claim 25, wherein apertures are formed through the heat spreader adjacent the rim portion of the heat spreader.

27. A lead frame, comprising:
    a plurality of leads having inner portions and outer portions;
    a heat spreader having a rim portion attached to the inner portions of the leads and a projecting portion that projects between ends of the inner portions of the leads, wherein apertures are formed through the heat spreader adjacent the rim portion of the heat spreader.

28. A semiconductor package, comprising:
    a plurality of leads having inner portions and outer portions;
    a heat spreader having a rim portion attached to the inner portions of the leads, and a projecting portion that projects between ends of the inner portions of the leads;
    a chip attached to an upper surface of the projecting portion; and
    a plurality of insulation members that are interposed between the chip and surfaces of the inner portions of the leads.

29. A lead frame, comprising:
    a plurality of leads having outer portions and inner portions; and
    a heat spreader having a rim portion attached to ends of the inner portions of the leads and a projecting portion having an upper surface that projects above lower surfaces of the ends of the inner portions of the leads, wherein a bottom surface of the heat spreader has a width that is greater than a width of an intermediate portion of the heat spreader.

* * * * *